US009209505B2

(12) United States Patent
Seo et al.

(10) Patent No.: US 9,209,505 B2
(45) Date of Patent: Dec. 8, 2015

(54) RESONANCE DEVICE AND FILTER INCLUDING THE SAME

(71) Applicant: Innertron, Inc., Incheon (KR)

(72) Inventors: Soo Duk Seo, Incheon (KR); Hak Rae Cho, Incheon (KR); Moon Bong Ko, Incheon (KR)

(73) Assignee: INNERTRON, INC. (KR)

( * ) Notice: Subject to any disclaimer, the term of this patent is extended or adjusted under 35 U.S.C. 154(b) by 0 days.

(21) Appl. No.: 14/288,635

(22) Filed: May 28, 2014

(65) Prior Publication Data

US 2015/0325898 A1 Nov. 12, 2015

(30) Foreign Application Priority Data

May 7, 2014 (KR) ........................ 10-2014-0053932

(51) Int. Cl.
*H03H 11/00* (2006.01)
*H01P 1/20* (2006.01)

(52) U.S. Cl.
CPC ........................................ *H01P 1/20* (2013.01)

(58) Field of Classification Search
None
See application file for complete search history.

(56) References Cited

U.S. PATENT DOCUMENTS

| | | | | |
|---|---|---|---|---|
| 5,446,729 | A * | 8/1995 | Jachowski | 370/339 |
| 2003/0001694 | A1* | 1/2003 | Ma et al. | 333/188 |
| 2010/0181869 | A1* | 7/2010 | Pereira da Cunha et al. | 310/313 R |
| 2010/0188174 | A1* | 7/2010 | Zhang et al. | 333/203 |

FOREIGN PATENT DOCUMENTS

KR 1020100048862 5/2010

* cited by examiner

*Primary Examiner* — Stanetta Isaac
(74) *Attorney, Agent, or Firm* — Cantor Colburn LLP

(57) ABSTRACT

A resonance device including a plurality of signal input/output ports, further including: a plurality of resonators arranged in a state of being spaced apart from each other; and a notch resonator formed at a side of the plurality of resonators, wherein the notch resonator includes: a laminated part having a laminated structure formed by layering a plurality of conductive layers; a first transmitting layer connected to one of the plurality of conductive layers; and a bridge connected between the first transmitting layer and one of the plurality of resonators, wherein one of the plurality of signal input/output ports is connected to the bridge.

10 Claims, 13 Drawing Sheets

RESONANCE DEVICE AND FILTER INCLUDING THE SAME

CROSS REFERENCE TO RELATED APPLICATION(S)

This application claims the benefit of Korean Patent Application No. 10-2014-0053932, filed on May 7, 2014, entitled RESONANCE DEVICE AND FILTER INCLUDING THE SAME, which is hereby incorporated by reference in its entirety into this application.

BACKGROUND OF THE INVENTION

1. Field of the Invention

The exemplary embodiments according to the concept of the present invention relate, in general, to a resonance device and, more particularly, to a resonance device having a laminated structure and including a notch resonator connected to one of a plurality of resonators via a bridge, and to a filter including the resonance device.

2. Description of the Related Art

Generally, communication systems use a variety of filters. In communication systems, the filters are devices which screen for and allow to pass only specified frequency band signals, and are classified into low pass filters (LPF), band pass filters (BPF), high pass filters (HPF), band stop filters (BSF), etc. according to frequency bands filtered thereby.

Further, according to methods of manufacturing filters or devices used in filters, the filters may be classified into LC filters, transmission line filters, cavity filters, dielectric resonator (DR) filters, ceramic filters, coaxial filters, waveguide filters, SAW (Surface Acoustic Wave) filters, etc.

To simultaneously realize narrow-band characteristics and excellent intercepting characteristics of a filter, it is required to use a resonator having a high Q-factor. In this case, the resonator typically takes the form of a PCB (Printed Circuit Board) type, a dielectric type or a monoblock type resonator.

DOCUMENTS OF RELATED ART

Patent Document 1 Korean Patent Application Publication No. 10-2010-0048862.

SUMMARY OF THE INVENTION

Accordingly, the present invention has been made keeping in mind the above problems occurring in the related art, and the present invention is intended to propose a resonance device and a filter including the resonance device, in which the resonance device has a laminated structure and includes a notch resonator connected to one of a plurality of resonators via a bridge; thereby realizing excellent narrow-band characteristics and excellent intercepting characteristics of the filter.

In an embodiment of the present invention, there is provided a resonance device including a plurality of signal input/output ports, further including: a plurality of resonators arranged in a state of being spaced apart from each other; and a notch resonator formed at a side of the plurality of resonators, wherein the notch resonator includes: a laminated part having a laminated structure formed by layering a plurality of conductive layers; a first transmitting layer connected to one of the plurality of conductive layers; and a bridge connected between the first transmitting layer and one of the plurality of resonators, wherein one of the plurality of signal input/output ports may be connected to the bridge.

In an embodiment, the resonance device may further include: a case provided with a first ground surface and a second ground surface, the first and second ground surfaces facing each other, the case enveloping the plurality of resonators and the notch resonator therein.

In an embodiment, the plurality of conductive layers may include: a first conductive layer grounded to the first ground surface; a second conductive layer grounded to the first ground surface and placed in a state of being spaced apart from the first conductive layer; and a third conductive layer placed between the first conductive layer and the second conductive layer in a state of being spaced apart from the first conductive layer and the second conductive layer, without being grounded to the first ground surface, wherein the first transmitting layer may be connected to the third conductive layer.

In an embodiment, the plurality of conductive layers may include: a first conductive layer connected to the first ground surface; and a second conductive layer placed in a state of being spaced apart from the first conductive layer, without being grounded to the first ground surface, wherein the first transmitting layer may be connected to the second conductive layer.

In an embodiment, the resonance device may further include: a second transmitting layer connected to another one of the plurality of conductive layers, wherein the plurality of conductive layers may include: a first conductive layer connected to the first ground surface; a second conductive layer grounded to the first ground surface and placed in a state of being spaced apart from the first conductive layer; a third conductive layer placed between the first conductive layer and the second conductive layer in a state of being spaced apart from the first conductive layer and the second conductive layer, without being grounded to the first ground surface; and a fourth conductive layer placed between the second conductive layer and the third conductive layer in a state of being spaced apart from the second conductive layer and the third conductive layer, without being grounded to the first ground surface, wherein the laminated part may further include a via electrically connecting the third conductive layer and the fourth conductive layer to each other.

In an embodiment, the first transmitting layer may be connected to the third conductive layer, and the second transmitting layer may be connected to the fourth conductive layer.

In an embodiment, the plurality of conductive layers may include: a first conductive layer connected to the first ground surface; a second conductive layer grounded to the first ground surface and placed in a state of being spaced apart from the first conductive layer; a third conductive layer placed between the first conductive layer and the second conductive layer in a state of being spaced apart from the first conductive layer and the second conductive layer, without being grounded to the first ground surface; a fourth conductive layer placed in a state of being spaced apart from the first conductive layer and opposite to the third conductive layer based on the first conductive layer, without being grounded to the first ground surface; and a fifth conductive layer placed in a state of being spaced apart from the second conductive layer and opposite to the third conductive layer based on the second conductive layer, without being grounded to the first ground surface, wherein the laminated part may further include a via electrically connecting the third conductive layer, the fourth conductive layer and the fifth conductive layer to each other.

In an embodiment, the first transmitting layer may be connected to the third conductive layer.

In an embodiment, the space inside the case may be charged with ceramic.

In an embodiment of the present invention, there is provided a band pass filter including the resonance device.

The resonance device of an embodiment of the present invention is advantageous in that it has a laminated structure and includes a notch resonator connected to one of a plurality of resonators via a bridge, thereby realizing excellent narrowband characteristics and excellent intercepting characteristics.

BRIEF DESCRIPTION OF THE DRAWINGS

The above and other objects, features and advantages of the present invention will be more clearly understood from the following detailed description when taken in conjunction with the accompanying drawings, in which.

DESCRIPTION OF SYMBOLS

Figure 1:
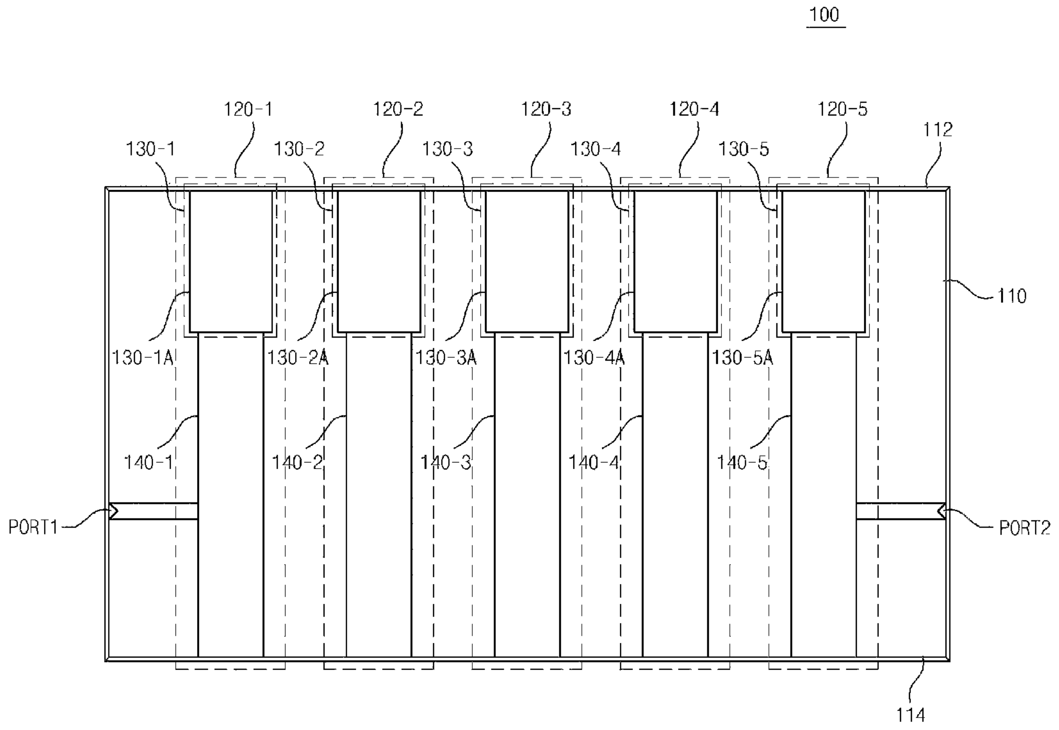
FIG. 1 is a plan view of a resonance device to which the operational performance of a resonance device according to an embodiment of the present invention is compared.

100, 200A, 200B: resonance device
120-1~120-5, 220-1~220-4: resonator
250: Notch resonator
130-1~130-5, 230-1~230-4, 255: laminated part
140-1-1~140-5, 240-1~240-4, 270: transmitting layer
280: bridge

DETAILED DESCRIPTION OF THE INVENTION

In the following description, the structural or functional description specified to exemplary embodiments according to the concept of the present invention is intended to describe the exemplary embodiments, so it should be understood that the present invention may be variously embodied, without being limited to the exemplary embodiments.

The exemplary embodiments according to the concept of the present invention may be variously modified and may have various shapes, so examples of which are illustrated in the accompanying drawings and will be described in detail with reference to the accompanying drawings. However, it should be understood that the exemplary embodiments according to the concept of the present invention are not limited to the embodiments which will be described hereinbelow with reference to the accompanying drawings, but various modifications, equivalents, additions and substitutions are possible, without departing from the scope and spirit of the invention.

It will be understood that, although the terms first, second, etc. may be used herein to describe various elements, these elements should not be limited by these terms. These terms are only used to distinguish one element, from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween.

In contrast, it should be understood that when an element is referred to as being "directly coupled" or "directly connected" to another element, there are no intervening elements present. Further, the terms used herein to describe a relationship between elements, for example, "between", "directly between", "adjacent" or "directly adjacent" should be interpreted in the same manner as those described above.

The terminology used herein is for the purpose of describing particular embodiments only and is not intended to be limiting. As used herein, the singular forms "a," "an" and "the" are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
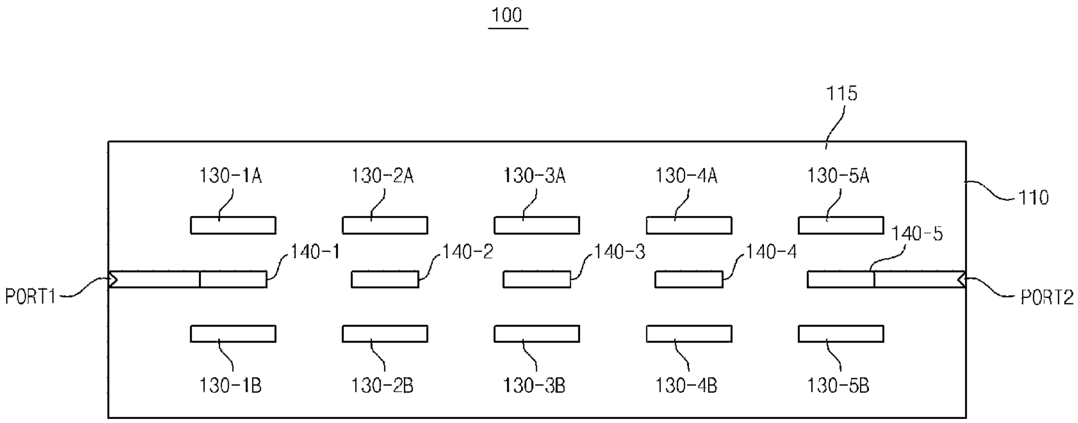
FIG. 2 is a front view of an embodiment of the resonance device shown in FIG. 1.

FIG. 1 is a plan view of a resonance device to which the operational performance of a resonance device according to an embodiment of the present invention is compared. FIG. 2 is a front view of an embodiment of the resonance device shown in FIG. 1.

As shown in FIGS. 1 and 2, the resonance device 100 may include a case 110, a plurality of resonators 120-1 to 120-5 provided in the case 110, and a plurality of ports PORT1 and PORT2.

Although the case 110 shown in FIG. 1 has a rectangular shape, it should be understood that the shape of the case 110 is not limited to the rectangular shape.

The case 110 may include a first ground surface 112 and a second ground surface 114 which face each other. In an embodiment, all the surfaces of the case 110, which include the first ground surface 112 and the second ground surface 114, may be made of a conductive material. In another embodiment, all or a part of the surfaces of the case 110, with the exception of the first ground surface 112 and the second ground surface 114, may be made of a conductive material.

The case 110 made of a conductive material may protect the plurality of resonators 120-1 to 120-5 provided therein from external environment. In other words, the case 110 may intercept electromagnetic waves produced by other devices placed around the case 110 or by the flow of an electric current in a circuit, thereby preventing the external environment from affecting the operation of the resonators 120-1 to 120-5 provided in the case 110.

In an embodiment, the interior of the resonance device 100 which is a space 115 of the case 110 may be charged with a dielectric material, for example, ceramic.

The plurality of resonators 120-1 to 120-5 may include respective laminated parts 130-1 to 130-5 and respective transmitting layers 140-1 to 140-5.

Here, the laminated parts 130-1 to 130-5 may include respective conductive layers 130-1A to 130-5A and respective conductive layers 130-1B to 130-5B, in which the conductive layers 130-1A to 130-5A and associated conductive layers 130-1B to 130-5B are spaced apart from each other and form respective laminated structures.

The layer structure (for example, the number and arrangement of layers) of each of the resonators 120-1 to 120-5 including the respective laminated parts 130-1 to 130-5 and the respective transmitting layers 140-1 to 140-5 may be practically equal to the layer structure of a notch resonator which will be described later herein, so the layer structure of the resonators 120-1 to 120-5 will be described in detail later herein together with the structure of the notch resonator with reference to FIGS. 8 to 15.

The first port PORT1 may be connected to the transmitting layer 140-1 of the first resonator 120-1, and the second port PORT2 may be connected to the transmitting layer 140-5 of the fifth resonator 120-5.

Each of the first port PORT1 and the second port PORT2 may be a signal input port or a signal output port through which a signal is input to or output from the resonance device 100.

Figure 3:
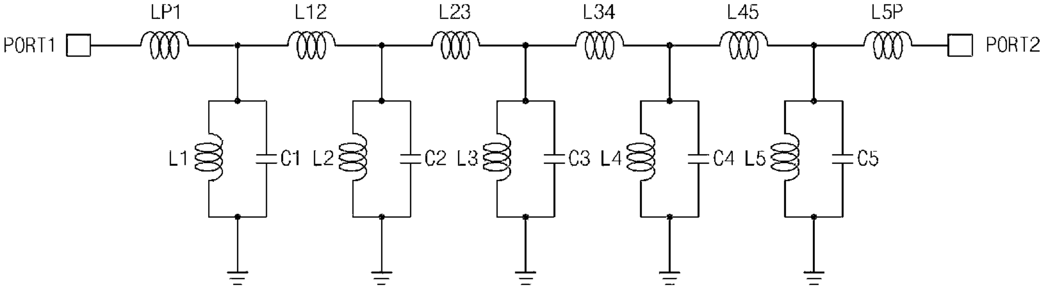
FIG. 3 is an equivalent circuit diagram of an embodiment of the resonance device shown in FIG. 1.

FIG. 3 is an equivalent circuit diagram of an embodiment of the resonance device shown in FIG. 1.

As shown in FIGS. 1 to 3, the laminated parts 130-1 to 130-5 and the transmitting layers 140-1 to 140-5 of the resonance device 100 of FIG. 1 may have capacitance components and inductance components, and may be equivalent to an LC resonant circuit of FIG. 3 based on the capacitance components and the inductance components. Furthermore, the resonance device 100 of FIG. 1 may function as a band pass filter (BPF).

The inductance component of the first resonator 120-1 may be equivalent to a first inductor L1, and the capacitance component of the first resonator 120-1 may be equivalent to a first capacitor C1.

Further, the inductance component between the first port PORT1 and the first resonator 120-1 may be equivalent to a sixth inductor LP1, and the inductance component between the first resonator 120-1 and the second resonator 120-2 may be equivalent to a seventh inductor L12.

In the same manner, the resonance device 100 of FIG. 1 may be equivalent to the LC resonant circuit of FIG. 3 which includes a plurality of inductors L1 to L5, LP1, L12, L23, L34, L45 and L5P and a plurality of capacitors C1 to C5.

Further, the magnitudes of the capacitance components of the resonators 120-1 to 120-5 may be controlled by controlling at least one of the number, shape and area of the conductive layers forming the respective laminated parts 130-1 to 130-5, and the spaced distance between a plurality of laminated conductive layers.

Further, the magnitudes of the inductance components of the resonators 120-1 to 120-5 may be controlled by controlling at least one the length and area of the respective transmitting layers 140-1 to 140-5.

In other words, the magnitudes of the capacitance components and the magnitudes of the inductance components of the resonance device 100 may be controlled by controlling the above-mentioned factors. When the resonance device 100 functions as a band pass filter, the passband of the band pass filter may be controlled by controlling the magnitudes of the capacitance components and the magnitudes of the inductance components.

Figure 4:
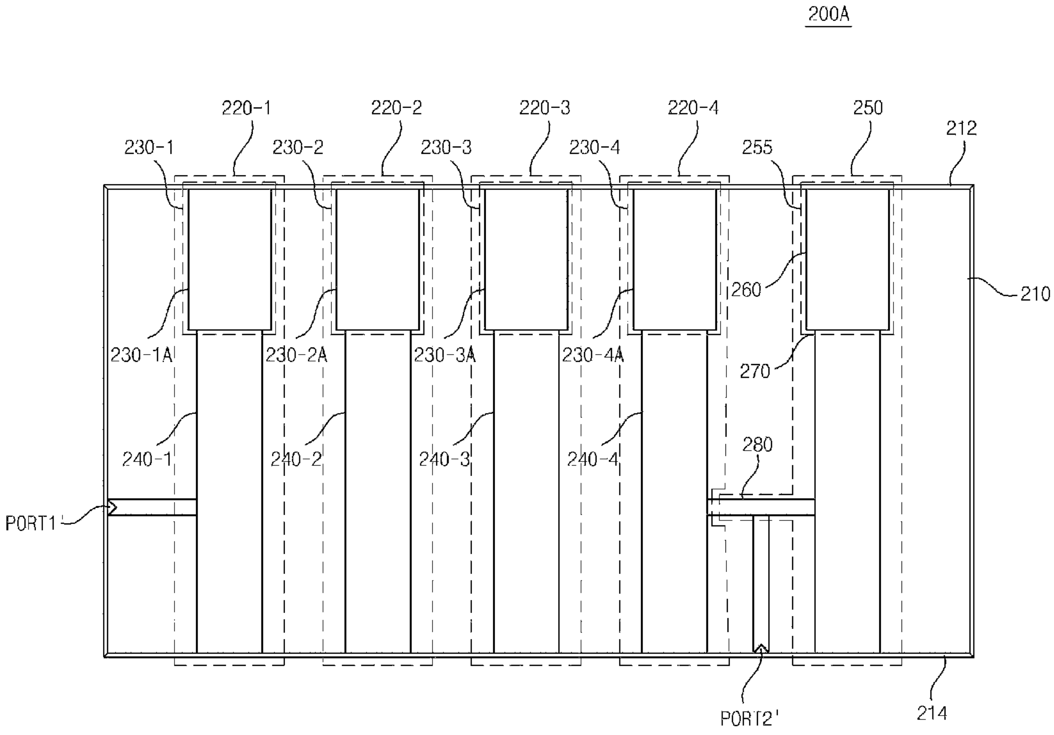
FIG. 4 is a plan view of a resonance device according to an embodiment of the present invention.
Figure 5:
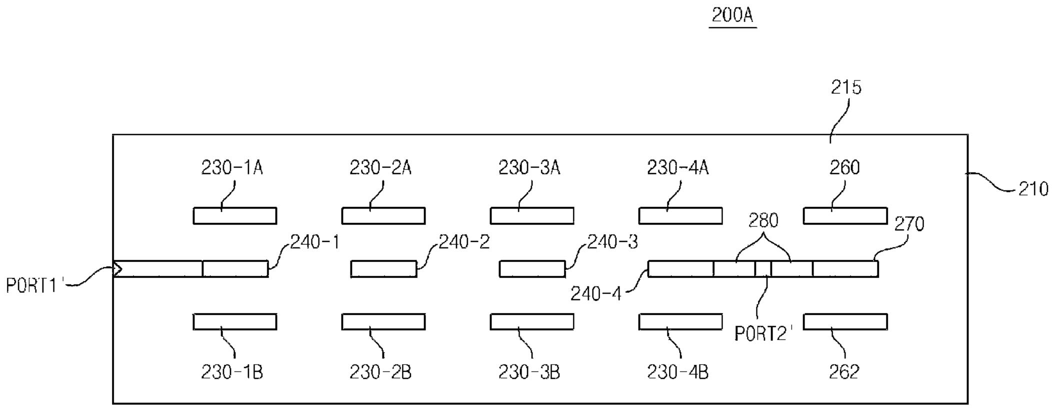
FIG. 5 is a front view of an embodiment of the resonance device shown in FIG. 4.

FIG. 4 is a plan view of a resonance device according to an embodiment of the present invention. FIG. 5 is a front view of an embodiment of the resonance device shown in FIG. 4.

As shown in FIGS. 1, 4 and 5, the resonance device 200A according to an embodiment of the present invention may include a notch resonator 250 instead of the fifth resonator 120-5 of the resonance device 100 of FIG. 1.

In this case, the arrangement of the second port PORT2' may be changed from that of the second port PORT2 of the resonance device 100 shown in FIG. 1.

Here, the structure of the first port PORT1' and the plurality of resonators 220-1 to 220-4 of the resonance device 200A shown in FIG. 4 may practically remain the same as the structure of the first port PORT1 and the plurality of resonators 120-1 to 120-4 of the resonance device 100 shown in FIG. 1.

That is, the conductive layers 230-1A to 230-4A, 230-1B to 230-4B (see FIG. 5) and the transmitting layers 240-1 to 240-4 (see FIG. 5) of the resonance device 200A are practically equal to the conductive layers 130-1A to 130-4A, 130-1B to 130-4B (see FIG. 2) and the transmitting layers 140-1 to 140-4 (see FIG. 2) of the resonance device 100, and further explanation thereof will be omitted in the following description.

In an embodiment, all the surfaces of a case 210, which include a first ground surface 212 and a second ground surface 214, may be made of a conductive material. In another embodiment, all or a part of the surfaces of the case 210 with the exception of the first ground surface 212 and the second ground surface 214 may be made of a conductive material.

In an embodiment, the interior of the resonance device 200A which is the space 215 of the case 210 may be charged with a dielectric material, for example, ceramic.

The notch resonator 250 may include a laminated part 255, a transmitting layer 270 and a bridge 280.

In an embodiment, the layer structure (for example, the number and arrangement of the layers) of the notch resonator 250 may be equal to the layer structure of the resonators 220-1 to 220-4.

However, in this case, the width and length of the layers (for example, 260, 262, 270) and the spaced distance of the layers (for example, 260, 262, 270) may be different from that of the resonators 220-1 to 220-4.

The bridge 280 may be connected between the transmitting layer 270 of the notch resonator 250 and the transmitting layer 240-4 of the fourth resonator 220-4. The second port PORT2' may be connected to the bridge 280.

The structure of the notch resonator 250 will be described in detail later herein with reference to FIGS. 8 to 15.

Figure 6:
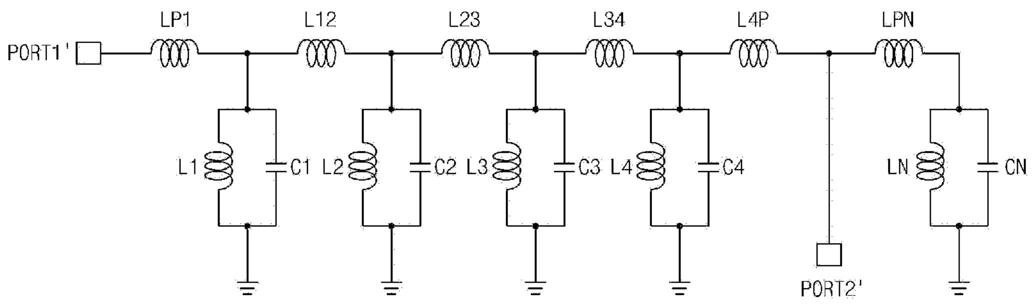
FIG. 6 is an equivalent circuit diagram of an embodiment of the resonance device shown in FIG. 4.

FIG. 6 is an equivalent circuit diagram of an embodiment of the resonance device shown in FIG. 4.

Referring to FIGS. 4 to 6, the laminated parts 230-1 to 230-4 and 260, the transmitting layers 240-1 to 240-4 and 270, and the bridge 280 of the resonance device 200A of FIG. 4 may have capacitance components and inductance components, and may be equivalent to an LC resonant circuit of FIG. 6 based on the capacitance components and inductance components. Further, the resonance device 200A of FIG. 6 may function as a band pass filter (BPF).

In the same manner, the inductors L1 to L4, LP1, L12, L23, L34 of FIG. 6 and the capacitors C1 to C4 of FIG. 6, which are the elements of the equivalent circuit of the resonators 220-1 to 220-4 of FIG. 4, may be equivalent to the inductors L1 to L4, LP1, L12, L23, L34 of FIG. 3 and the capacitors C1 to C4 of FIG. 3 which are the elements of the equivalent circuit of the resonators 120-1 to 120-4 of FIG. 1.

The inductance component of the notch resonator 250 may be equivalent to a notch inductor LN, and the capacitance component of the notch resonator 250 may be equivalent to a notch capacitor CN.

The inductance component between the fourth resonator 220-4 and the second port PORT2' may be equivalent to a ninth inductor L4P, and the inductance component between the second port PORT2' and the notch resonator 250 may be equivalent to a tenth inductor LPN.

The magnitude of the capacitance component of the notch resonator 250 may be controlled by controlling at least one of the number, shape and area of the conductive layers constituting the laminated part 255 of the notch resonator 250, and the spaced distance between the plurality of laminated conductive layers.

Further, the inductance component of the notch resonator 250 may be controlled by controlling at least one of the length and area of the transmitting layer 270 of the notch resonator 250.

In other words, the magnitude of the capacitance component and the magnitude of the inductance component of the notch resonator 250 may be controlled by controlling the above-mentioned factors. When the resonance device 200A functions as a band pass filter, the range of frequencies on which filter effects will be conferred in the passband of the band pass filter may be controlled by controlling the magnitude of the capacitance component and the magnitude of the inductance component, as will be described later herein with reference to FIG. 7.

Figure 7:
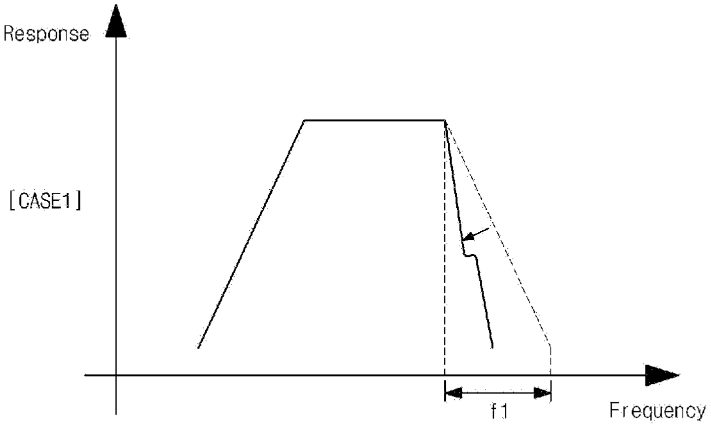
FIG. 7 is a graph showing the frequency response characteristics of the resonance device shown in FIG. 1 and the frequency response characteristics of the resonance device shown in FIG. 4 so as to compare the frequency response characteristics to each other.
Figure 7:
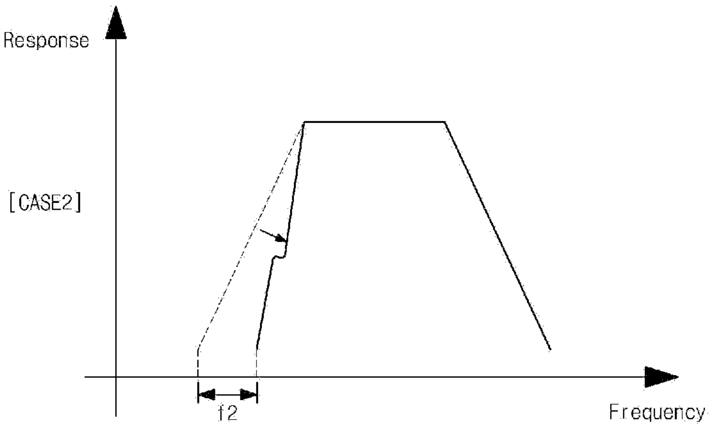

FIG. 7 is a graph showing the frequency response characteristics of the resonance device shown in FIG. 1 and the frequency response characteristics of the resonance device shown in FIG. 4 so as to compare the frequency response characteristics to each other.

As shown in FIGS. 1, 4, 6 and 7, when it is assumed that, in the first case CASE1, the band pass characteristics of the resonance device 100 of FIG. 1 within a first frequency band f1 are shown by the dotted line, the band pass characteristics of the resonance device 200A of FIG. 4 may be expressed by the solid line.

That is, in the first case CASE1, notch filter effects can be conferred on the first frequency band f1 by controlling the factors of the notch resonator 250, which are, for example, the number, shape and area of the conductive layers of the laminated part 255 of the notch resonator 250, the spaced distance between the plurality of laminated conductive layers, and the length and area of the transmitting layer 270 of the laminated part 255.

Further, when it is assumed that, in the second case CASE2, the band pass characteristics of the resonance device 100 of FIG. 1 within a second frequency band f2 are shown by the dotted line, the band pass characteristics of the resonance device 200A of FIG. 4 may be expressed by the solid line.

That is, in the second case CASE2, notch filter effects can be conferred on the second frequency band f2 by controlling the factors of the notch resonator 250, which are, for example, the number, shape and area of the conductive layers of the laminated part 255 of the notch resonator 250, the spaced distance between the plurality of laminated conductive layers, and the length and area of the transmitting layer 270 of the laminated part 255.

Figure 8:
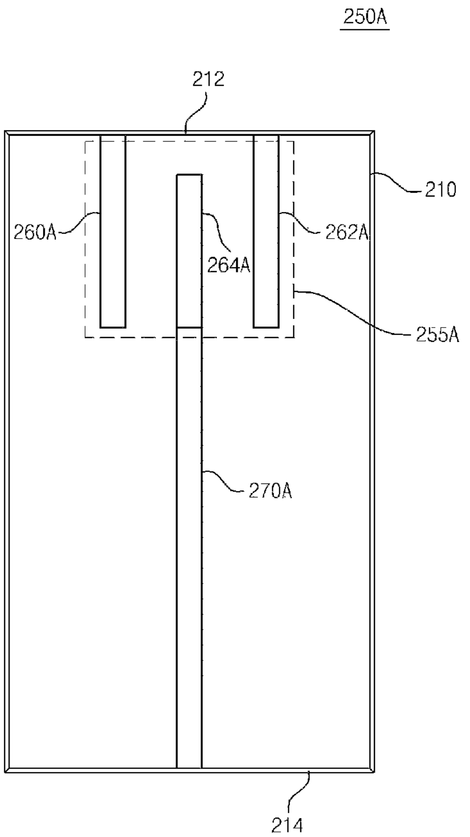
FIG. 8 is a side view of an embodiment of a notch resonator shown in FIG. 4.
Figure 9:
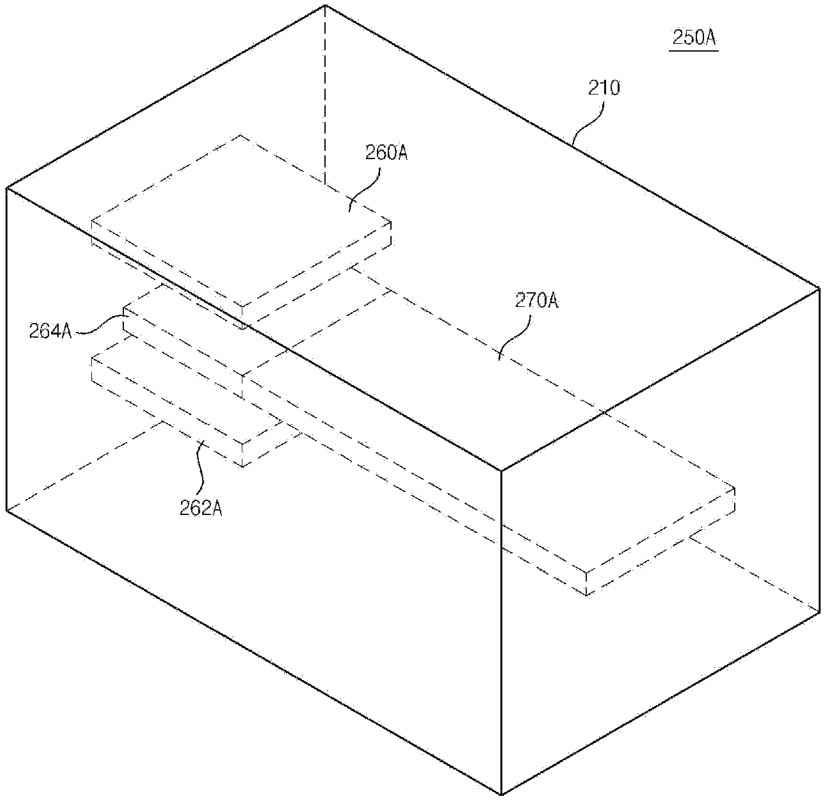
FIG. 9 is a perspective view of the notch resonator shown in FIG. 8.

FIG. 8 is a side view of an embodiment of the notch resonator shown in FIG. 4. FIG. 9 is a perspective view of the notch resonator shown in FIG. 8.

As shown in FIGS. 4, 8 and 9, a notch resonator 250A that is an embodiment of the notch resonator 250 of FIG. 4 may include a laminated part 255A and a transmitting layer 270A.

For ease of description, the notch resonator 250A of FIGS. 8 and 9 is illustrated with the bridge 280 being omitted.

The laminated part 255A may include: a first conductive layer 260A grounded to the first ground surface 212, a second conductive layer 262A that is grounded to the first ground surface 212 and is spaced apart from the first conductive layer 260A, and a third conductive layer 264A that is placed between the first conductive layer 260A and the second conductive layer 262A without being grounded to the first ground surface 212.

Here, the transmitting layer 270A may be connected to the third conductive layer 264A and may be grounded to the second ground surface 214.

In an embodiment, the resonators 220-1 to 220-4 of FIG. 4 may have the same layer structure (for example, the number and arrangement of layers) as that of the notch resonator 250A. In this case, the space 115 (see FIG. 5) inside the case 210 (see FIG. 4) may be charged with a dielectric material having a permittivity of 15 to 45. The resonance device 200A of FIG. 4 may function as a band pass filter (for example, a narrow band pass filter) having central frequencies of 800 MHz~2.6 GHz.

Figure 10:
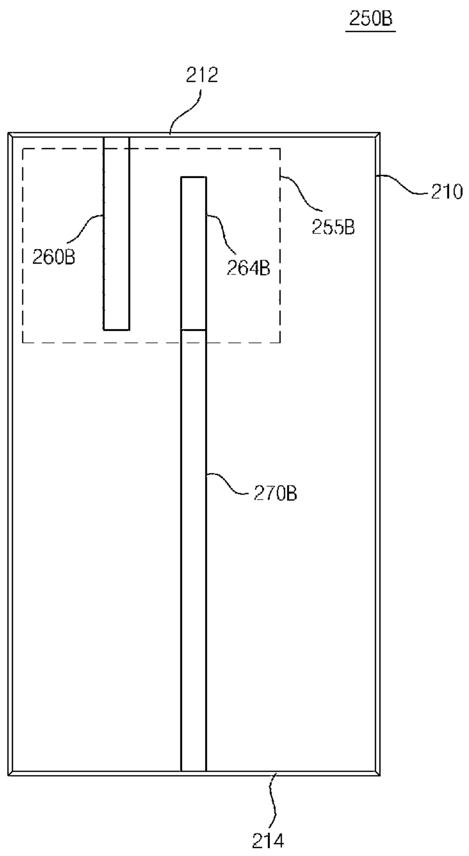
FIG. 10 is a side view of another embodiment of the notch resonator shown in FIG. 4.
Figure 11:
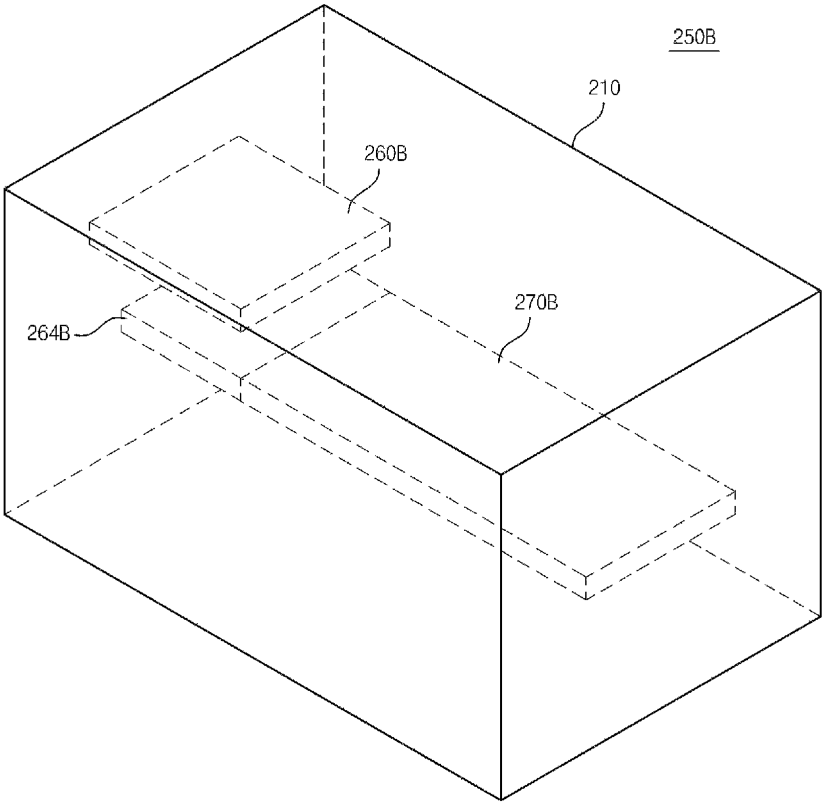
FIG. 11 is a perspective view of the notch resonator shown in FIG. 10.

FIG. 10 is a side view of another embodiment of the notch resonator shown in FIG. 4. FIG. 11 is a perspective view of the notch resonator shown in FIG. 10.

As shown in FIGS. 4, 10 and 11, a notch resonator 250B that is another embodiment of the notch resonator 250 of FIG. 4 may include a laminated part 255B and a transmitting layer 270B.

For ease of description, the notch resonator 250B of FIGS. 10 and 11 is illustrated with the bridge 280 being omitted.

The laminated part 255B may include: a first conductive layer 260B grounded to the first ground surface 212, and a second conductive layer 264B placed in a state of being spaced apart from the first conductive layer 260B without being grounded to the first ground surface 212.

The transmitting layer 270B may be connected to the second conductive layer 264B, and may be grounded to the second ground surface 214.

In an embodiment, the resonators 220-1 to 220-4 of FIG. 4 may have the same layer structure (for example, the number and arrangement of layers) as that of the notch resonator 250B. In this case, the space 115 (see FIG. 5) inside the case 210 (see FIG. 4) may be charged with a dielectric material having a permittivity of 15 to 45. The resonance device 200A of FIG. 4 may function as a band pass filter (for example, a narrow band pass filter) having central frequencies of 800 MHz~2.6 GHz.

Figure 12:
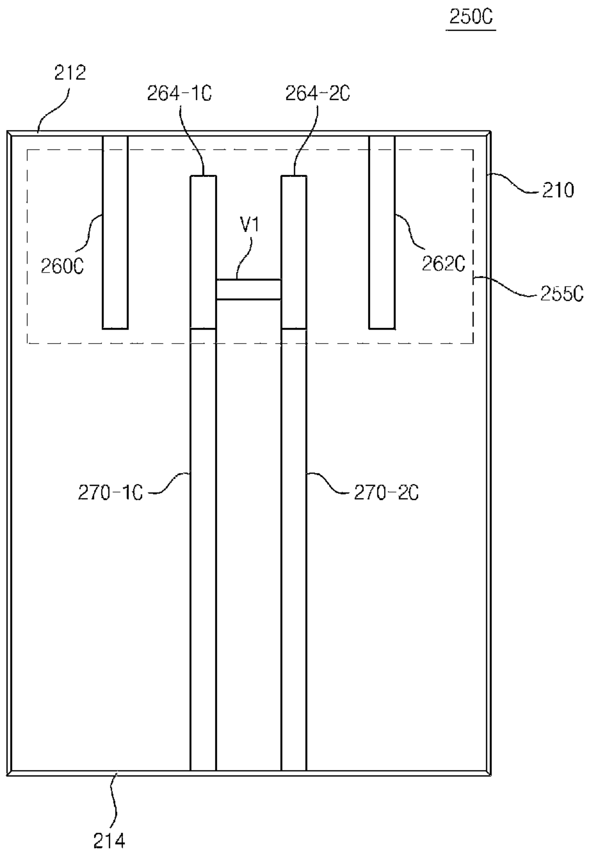
FIG. 12 is a side view of a further embodiment of the notch resonator shown in FIG. 4.
Figure 13:
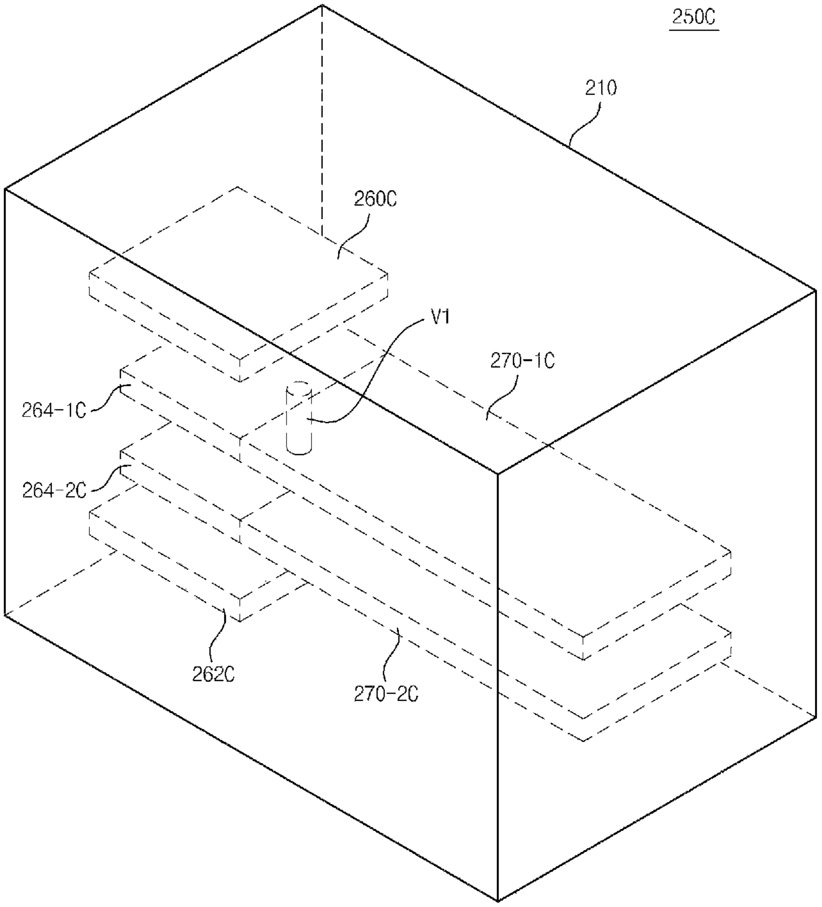
FIG. 13 is a perspective view of the notch resonator shown in FIG. 12.

FIG. 12 is a side view of a further embodiment of the notch resonator shown in FIG. 4. FIG. 13 is a perspective view of the notch resonator shown in FIG. 12.

As shown in FIGS. 4, 12 and 13, a notch resonator 250C that is a further embodiment of the notch resonator 250 of FIG. 4 may include a laminated part 255C and transmitting layers 270-1C and 270-2C.

For ease of description, the notch resonator 250C of FIGS. 12 and 13 is illustrated with the bridge 280 being omitted.

The laminated part 255C may include: a first conductive layer 260C, a second conductive layer 262C, a third conductive layer 264-1C, a fourth conductive layer 264-2C, and a via V1.

The first conductive layer 260C and the second conductive layer 262C may be connected to the first ground surface 212, and may be placed in a state of being spaced apart from each other.

The third conductive layer 264-1C and the fourth conductive layer 264-2C may be placed between the first conductive layer 260C and the second conductive layer 262C in a state of being spaced apart from the first conductive layer 260C and the second conductive layer 262C, respectively, without being grounded to the first ground surface 212.

The fourth conductive layer 264-2C may be placed between the third conductive layer 264-1C and the second conductive layer 262C.

The third conductive layer 264-1C and the fourth conductive layer 264-2C may be placed in a state of being spaced apart from each other.

The third conductive layer 264-1C and the fourth conductive layer 264-2C may be electrically connected to each other by the via V1.

The first transmitting layer 270-1C may be connected to the third conductive layer 264-1C, and may be grounded to the second ground surface 214, and the second transmitting layer 270-2C may be connected to the fourth conductive layer 264-2C and may be grounded to the second ground surface 214.

In an embodiment, the resonators 220-1 to 220-4 of FIG. 4 may have the same layer structure (for example, the number and arrangement of layers) as that of the notch resonator 250C. In this case, the space 115 (see FIG. 5) inside the case 210 (see FIG. 4) may be charged with a dielectric material having a permittivity of 15 to 45. The resonance device 200A of FIG. 4 may function as a band pass filter (for example, a narrow band pass filter) having central frequencies of 800 MHz~2.6 GHz.

In an embodiment, the notch resonator 250C may further include another via (not shown) in addition to the via V1.

Figure 14:
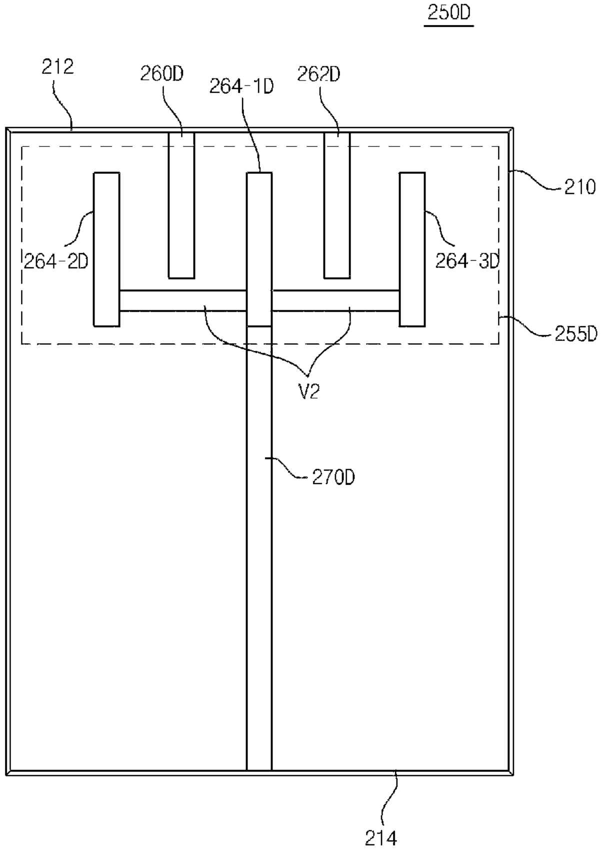
FIG. 14 is a side view of still another embodiment of the notch resonator shown in FIG. 4.
Figure 15:
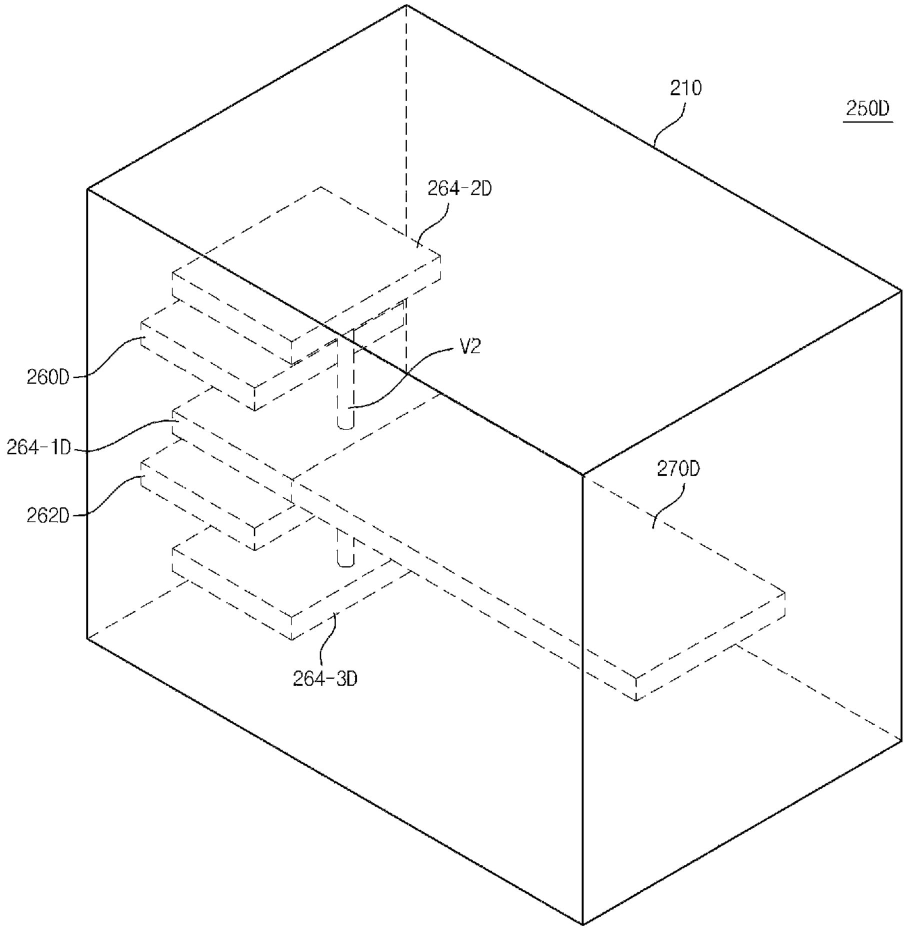
FIG. 15 is a perspective view of the notch resonator shown in FIG. 14.

FIG. 14 is a side view of still another embodiment of the notch resonator shown in FIG. 4. FIG. 15 is a perspective view of the notch resonator shown in FIG. 14.

As shown in FIGS. 4, 14 and 15, a notch resonator 250D that is a still another embodiment of the notch resonator 250 of FIG. 4 may include a laminated part 255D and a transmitting layer 270D.

For ease of description, the notch resonator 250D of FIGS. 14 and 15 is illustrated with the bridge 280 being omitted.

The laminated part 255D may include a first conductive layer 260D, a second conductive layer 262D, a third conductive layer 264-1D, a fourth conductive layer 264-2D, a fifth conductive layer 264-3D and a via V2.

The first conductive layer 260D and the second conductive layer 262D may be connected to the first ground surface 212, and may be placed in a state of being spaced apart from each other.

The third conductive layer 264-1D may be placed between the first conductive layer 260D and the second conductive layer 262D in a state of being spaced apart from the first conductive layer 260D and the second conductive layer 262D, without being grounded to the first ground surface 212.

The fourth conductive layer 264-2D may be placed in a state of being spaced apart from the first conductive layer 260D and opposite to the third conductive layer 264-1D based on the first conductive layer 260D, without being grounded to the first ground surface 212.

The fifth conductive layer 264-3D may be placed in a state of being spaced apart from the second conductive layer 262D and opposite to the third conductive layer 264-1D based on the second conductive layer 262D, without being grounded to the first ground surface 212.

The via V2 may electrically connect the third conductive layer 264-1D, the fourth conductive layer 264-2D and the fifth conductive layer 264-3D to each other.

The transmitting layer 270D may be connected to the third conductive layer 264-1D and may be grounded to the second ground surface 214.

In an embodiment, the resonators 220-1 to 220-4 of FIG. 4 may have the same layer structure (for example, the number and arrangement of layers) as that of the notch resonator 250D. In this case, the space 115 (see FIG. 5) inside the case 210 (see FIG. 4) may be charged with a dielectric material having a permittivity of 15 to 45. The resonance device 200A of FIG. 4 may function as a band pass filter (for example, a narrow band pass filter) having central frequencies of 800 MHz~2.6 GHz.

In an embodiment, the notch resonator 250C may further include another via (not shown) in addition to the via V2.

Figure 16:
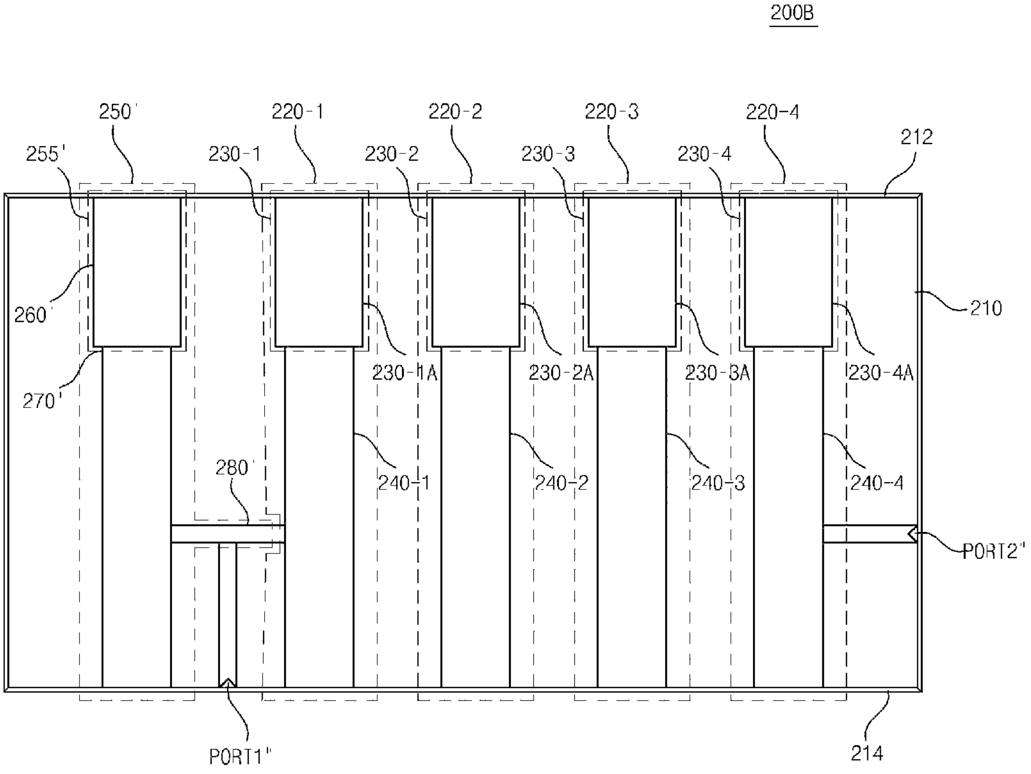
FIG. 16 is a plan view of a resonance device according to another embodiment of the present invention.

FIG. 16 is a plan view of a resonance device according to another embodiment of the present invention.

As shown in FIGS. 4 and 16, the resonance device 200B according to the embodiment of the present invention includes a notch resonator 250'. Here, the notch resonator 250' may be connected to the first resonator 220-1 by a bridge 280'.

In this embodiment, the first port PORT1" may be connected to the bridge 280'.

Here, the structure of the resonance device 200B of FIG. 16 practically remains the same as the structure of the resonance device 200A of FIG. 4, excepting that the notch resonator 250' is connected to the first resonator 220-1.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A resonance device comprising a plurality of signal input/output ports, further comprising:

a plurality of resonators arranged in a state of being spaced apart from each other; and a notch resonator formed at a side of the plurality of resonators, wherein the notch resonator includes:

a laminated part having a laminated structure formed by layering a plurality of conductive layers;

a first transmitting layer connected to one of the plurality of conductive layers; and a bridge connected between the first transmitting layer and one of the plurality of resonators, wherein one of the plurality of signal input/output ports is connected to the bridge.

2. The resonance device of claim 1, further comprising:

a case provided with a first ground surface and a second ground surface, the first and second ground surfaces facing each other, the case enveloping the plurality of resonators and the notch resonator therein.

3. The resonance device of claim 2, wherein the plurality of conductive layers comprise:

a first conductive layer grounded to the first ground surface;

a second conductive layer grounded to the first ground surface and placed in a state of being spaced apart from the first conductive layer; and a third conductive layer placed between the first conductive layer and the second conductive layer in a state of being spaced apart from the first conductive layer and the second conductive layer, without being grounded to the first ground surface, wherein the first transmitting layer is connected to the third conductive layer.

4. The resonance device of claim 2, wherein the plurality of conductive layers comprise:

a first conductive layer connected to the first ground surface; and a second conductive layer placed in a state of being spaced apart from the first conductive layer, without being grounded to the first ground surface, wherein the first transmitting layer is connected to the second conductive layer.

5. The resonance device of claim 2, further comprising:

a second transmitting layer connected to another one of the plurality of conductive layers, wherein the plurality of conductive layers comprise:

a first conductive layer connected to the first ground surface;

a second conductive layer grounded to the first ground surface and placed in a state of being spaced apart from the first conductive layer;

a third conductive layer placed between the first conductive layer and the second conductive layer in a state of being spaced apart from the first conductive layer and the second conductive layer, without being grounded to the first ground surface; and a fourth conductive layer placed between the second conductive layer and the third conductive layer in a state of being spaced apart from the second conductive layer and the third conductive layer, without being grounded to the first ground surface, wherein the laminated part further includes a via electrically connecting the third conductive layer and the fourth conductive layer to each other.

6. The resonance device of claim 5, wherein the first transmitting layer is connected to the third conductive layer, and the second transmitting layer is connected to the fourth conductive layer.

7. The resonance device of claim 2, wherein the plurality of conductive layers comprise:

a first conductive layer connected to the first ground surface;

a second conductive layer grounded to the first ground surface and placed in a state of being spaced apart from the first conductive layer;

a third conductive layer placed between the first conductive layer and the second conductive layer in a state of being spaced apart from the first conductive layer and the second conductive layer, without being grounded to the first ground surface;

a fourth conductive layer placed in a state of being spaced apart from the first conductive layer and opposite to the third conductive layer based on the first conductive layer, without being grounded to the first ground surface; and a fifth conductive layer placed in a state of being spaced apart from the second conductive layer and opposite to the third conductive layer based on the second conductive layer, without being grounded to the first ground surface, wherein the laminated part further includes a via electrically connecting the third conductive layer, the fourth conductive layer and the fifth conductive layer to each other.

8. The resonance device of claim 7, wherein the first transmitting layer is connected to the third conductive layer.

9. The resonance device of claim 2, wherein a space inside the case is charged with ceramic.

10. A band pass filter including the resonance device of claim 1.

* * * * *